United States Patent [19]

Harper

[11] 4,089,687

[45] May 16, 1978

[54] PHOTOGRAPHIC METHOD FOR PRINTING PARTICLE PATTERN WITH IMPROVED ADHERENCE UTILIZING VANADATES

[75] Inventor: Stanley Arthur Harper, New Providence, Pa.

[73] Assignee: RCA Corporation, New York, N.Y.

[21] Appl. No.: 405,507

[22] Filed: Oct. 11, 1973

[51] Int. Cl.² .............................................. G03C 5/00
[52] U.S. Cl. .................................. 96/35.1; 96/36.1; 96/93; 96/115 R; 96/115 P; 427/53; 427/54; 427/64; 427/68
[58] Field of Search ............... 96/115 R, 115 P, 36.1, 96/93, 35.1, 36; 427/53, 54, 64, 68

[56] References Cited

U.S. PATENT DOCUMENTS 3,533,791 10/1970 Angelucci .................. 96/36.1

*Primary Examiner*—Edward C. Kimlin
*Attorney, Agent, or Firm*—G. H. Bruestle; L. Greenspan

[57] ABSTRACT

Method comprises (a) applying to a supporting surface a coating comprised of a photosensitizable water-soluble polymer, a soluble dichromate photosensitizer for the polymer, a soluble vanadate, and particles of the pattern material; (b) exposing the coating to a pattern of actinic radiation until exposed portions of the coating are rendered insoluble; (c) and flushing the exposed coating with an aqueous solvent to remove soluble portions of the coating, while retaining the insoluble portions of the coating in place.

4 Claims, No Drawings

PHOTOGRAPHIC METHOD FOR PRINTING PARTICLE PATTERN WITH IMPROVED ADHERENCE UTILIZING VANADATES

BACKGROUND OF THE INVENTION

This invention relates to a novel photographic method for printing a particle pattern, such as a viewing-screen structure for a cathode-ray tube.

A commercial color television picture tube of the apertured-mask type is a cathode-ray tube which includes a screen structure comprised of a multiplicity of red-emitting, green-emitting, and blue-emitting phosphor elements upon the inner surface of the viewing window of the tube. Usually, these phosphor elements are arranged in groups of threes or triads in a regular pattern, each triad having a red-emitting dot, a green-emitting dot, and a blue-emitting dot. An apertured mask (also called shadow mask), positioned in the panel in closely spaced relation with the phosphor elements, aids in selectively exciting the phosphor elements.

In order to make a television picture with suitable resolution and color purity, the viewing screen must be comprised of a very large number of phosphor screen elements of relatively small and uniform sizes which are accurately positioned with respect to one another. In one process for printing the phosphor screen elements, the inner surface of the viewing window is coated with a mixture comprised of phosphor particles, a polyvinyl alcohol and a soluble dichromate sensitizer, such as ammonium dichromate, for the alcohol. Actinic radiation is projected from a small area source through the apertured mask incident upon the coating. The mask functions as a photographic negative (or positive) to transmit a pattern of radiation, which produces in the coating regions of greater solubility and regions with lesser solubility. The exposed coating is developed by flushing with an aqueous solvent, until the unexposed and substantially unexposed portions of coating are removed leaving the insoluble exposed portions, which are a particle pattern of phosphor elements, adhered to the supporting surface.

The development of the particle pattern is one of the critical steps in the process because the exposed regions of the coating may lack sufficient adherence to the supporting surface and therefore may be washed away. Excessive light exposure cannot be used as an aid to adherence, because as exposure is increased the insoluble portions grow in size and become too large. Consequently, one phosphor element might overlap another phosphor element. Since the phosphor element size is limited by a particular screen design, it is important that the proper exposure be provided to produce phosphor elements of the desired size as well as to have adequate adherence to the supporting surface.

SUMMARY OF THE INVENTION

It has been found that the addition of small amounts of soluble vanadates, for example ammonium metavanadate or sodium metavanadate, added to the prior dichromate-sensitized polyvinyl-alcohol coatings increases the adherence of the exposed portions of the coating to the supporting surface during development. At the same time, an enhancement of the photosensitivity of the coating is observed. This combination of desirable characteristics was not anticipated because, in general, enhanced photosensitivity which allows reduced exposure times usually results in a loss of adherence. Generally, the novel method may be used to print patterns of particulate material.

DETAILED DESCRIPTION OF PREFERRED EMBODIMENT

Example — Prepare a coating composition of the following formulation:
 292 grams green-emitting, copper-activated zinc-cadmium sulfide phosphor particles,
 233 grams 10-weight-percent aqueous solution of polyvinyl alcohol having an average molecular weight of about 170,000 to 220,000,
 13 grams 45-weight-percent aqueous solution of an acrylic polymer, such as a Rhoplex AC-73, marketed by Rohm and Haas Chemical Company, Philadelphia, Penna.,
 14 grams 10-weight-percent aqueous solution of ammonium dichromate,
 46 grams 0.5-weight-percent aqueous solution of ammonium vanadate $NH_4VO_3$,
 402 grams deionized water.

The coating composition is carefully mixed and the viscosity adjusted to be in the range of about 20 to 50 centipoises. The pH is about 6.4. The formulation is then flow coated upon the inner surface of the faceplate of a 25-inch rectangular color television picture tube and dried. The apertured mask for the faceplate is then inserted in the mounts provided therefor and the faceplate assembly positioned upon a lighthouse platform. Ultraviolet light from the small area light source in the lighthouse is projected through the mask which permits a pattern of light to fall incident upon and expose the coating for about 6 minutes. The faceplate panel is then removed from the lighthouse and the mask removed from the faceplate panel. The exposed coating is developed by flushing with water to remove the unexposed and substantially unexposed and soluble portions of the coating, while retaining the exposed and insoluble portions of the coating in place.

GENERAL CONSIDERATIONS

The novel method may be used to print any particle pattern (pattern of particulate material) upon any supporting surface. The particles may be luminescent, may be nonluminescent, may be light-absorbing, may be any body color in reflected light, and may have special properties such as being magnetic, or ferroelectric, or dielectric.

The novel method may be used particularly to print viewing-screen structures for cathode-ray tubes, electroluminescent devices and other displays. Dot screen and line screen structures are examples. By "viewing screen structure" is meant any component part of a viewing screen for a display device, for example, a luminescent layer, or a light-absorbing layer for a cathode-ray tube target; or an alpha numeric pattern for an electroluminescent display; or an informational pattern for an advertising or safety display. Where the particles are luminescent, they may emit in any portion of the spectrum as a result of any form of excitation.

The Example illustrates the use of the novel method to produce a screen structure (the green-emitting field) for a color television picture tube by the slurry process. Many suitable coating formulations for the novel method applied to the slurry process are described in U.S. Pat. No. 3,269,838 to T. A. Saulnier, Jr. Generally, the coating formulation is comprised of (1) a water-soluble polymer which is crosslinkable into insoluble form by actinic radiation in the presence of hexavalent chromium ions, (2) a soluble dichromate photosensitizer for the polymer, (3) a water-soluble vanadate, and (4) particles of the pattern material.

The polymer may be an organic colloid, such as gelatin or fish glue, but is preferably a polyvinyl alcohol having a molecular weight greater than about 120,000. The polymer must be "dichromatizable"; that is, capable of being rendered photosensitive by dichromate ions, particularly by hexavalent chromium ions, so that actinic radiation can render the polymer insoluble.

The photosensitizer is a source of hexavalent chromium ions and may be any soluble dichromate such as sodium dichromate, potassium dichromate, or ammonium dichromate. The photosensitizer may be present in amounts of about 2 to 10 weight percent of the weight of water-soluble polymer present. Concentrations of dichromate higher than 10 weight percent have little added effect. Although the photosensitivity speed is higher with 10-weight-percent dichromate present, lower concentrations often are used in practice because improved adherence is realized.

The screen-structure material may be, for example, luminescent particles, particles of inert material, or particles of light-absorbing material, which is to be photodeposited as a screen structure. The coating may, if desired, include a nondichromatizable resin such as an acrylic copolymer, which is not rendered photosensitive by dichromate ions but may otherwise affect the properties of the coating.

The vanadate may be any soluble vanadate, such as sodium metavanadate $NaVO_3$, potassium metavanadate $KVO_3$ or ammonium metavanadate $NH_4VO_3$. The vanadate may be present in amounts of about 0.1 to 4.0 weight percent of the weight of water-soluble dichromatizable polymer present. Enhancement of sensitization with as low as 0.1 percent concentrations is noticeable; however typical concentrations are about 1.0 weight percent vanadate. Higher concentrations up to about 4.0 weight percent vanadate also display the characteristics of improved adherence and enhanced photosensitivity, but appear to have about the same effect as compositions containing about 1 to 2 weight percent vanadate.

The coating is exposed to a pattern of actinic radiation. Any actinic radiation such as visible light rays, ultraviolet light rays, or cathode rays may be used. Equipments for exposing the coating are described in the art. A significant quality of the exposure is that, although coating portions may be insolubilized by the actinic radiation, nevertheless the insoluble coating portions may not adhere sufficiently to the supporting surface to remain in place through the development step. Adherence may be evaluated in a quantitative manner by using the segment exposure method. By this method, segments of a coated glass panel are exposed for example from 3 to 10 minutes in one-minute increments over segments of the panel and then developed with water. After developing, the segments are examined to measure the phosphor-dot diameters microscopically and to determine the minimum exposure time where the dots just adhere or only a few dots are lost. The adherence number is defined as the ratio of the maximum exposure time to yield the required dot diameter to the minimum exposure time where the phosphor dots barely adhere. In the above example, if the required dot diameter is obtained on the eight-minute segment and dots are lost below 5-minutes exposure, then the adherence number is 8/5 or 1.6. A process is more desirable where the adherence number is greatest.

The results of five adherence tests with the mixed dichromate and vanadate sensitizers and with only a dichromate sensitizer are tabulated in the TABLE below showing the effects on the adherence number as well as the reduction in exposure time for the required dot diameters. The tests were run by the segment-exposure method described above, using the formulations shown in the example, except that the concentration of ammonium dichromate sensitizer, the selection of the vanadate, the concentration of the vanadate, and the exposure time were provided as indicated in the TABLE. All of the other parameters in the process, such as application cycle, screen weight, lighthouse intensity, lighthouse collimator size, method of developing, drying temperatures, etc. were essentially identical in each group. A direct comparison cannot be made by adherence number between test groups 1, 2, 3 etc., because the test conditions for the groups were not necessarily identical.

A vanadate has been used by itself as a sensitizer for polyvinyl alcohol, as described for example in Netherlands Patent Application No. 69-07022 filed May 7, 1969. However, it has been found that a vanadate sensitizer by itself imparts very poor adherence to the exposed film. This is illustrated in test 6A in the TABLE below where the polyvinyl alcohol was sensitized solely with about 6.5-weight-percent ammonium metavanadate. Even with a long exposure time (24 minutes), the adherence was very poor, being rated much less than 1.0; that is, many dot losses occurred even with a 24-minute exposure. However, when the same polyvinyl alcohol formulation was sensitized solely with 8-weight-percent ammonium dichromate in test 6B, the adherence number rose to 1.6.

The beneficial effect of the vanadate addition does not appear to be sensitive to the pH of the slurry. The maximum pH range evaluated was about 6.4 to 8.5. The Example given above appears as test 5B in the TABLE where the adherence number is 2.2. A comparable formulation without ammonium vanadate present yielded an adherence number of 1.6, as shown by test 5A.

TABLE

| Group and Test No. | Weight % Ammonium Dichromate | Weight % $NH_4VO_3$ or $NaVO_3$ | Exposure Time for Desired Dot Size (Minutes) | Adherence No. |
| --- | --- | --- | --- | --- |
| 1A | 10 | — | 9½ | 1.5 |
| 1B | 10 | 1.0 $NH_4VO_3$ | 8½ | 2.0 |
| 2A | 5 | — | 16 | 1.7 |
| 2B | 5 | 0.5 $NH_4VO_3$ | 8 | 2.2 |
| 2C | 5 | 0.25 $NH_4VO_3$ | 11 | 2.2 |
| 3A | 10 | — | 5½ | 1.2 |
| 3B | 10 | 1.0 $NaVO_3$ | 4½ | 1.8 |
| 4A | 9 | — | 12½ | 2.2 |
| 4B | 9 | 1.0 $NaVO_3$ | 9 | 2.5 |
| 4C | 9 | 4.0 $NaVO_3$ | 8½ | 2.4 |
| 5A | 6 | — | 7 | 1.6 |
| 5B | 6 | 1.0 $NH_4VO_3$ | 6 | 2.2 |
| 6A | 0 | 6.5 $NH_4VO_3$ | 24 | <1.0 |
| 6B | 8 | — | 13 | 1.6 |

I claim:

1. A photographic method for printing a pattern of particulate material upon a supporting surface comprising:
    (a) applying to said supporting surface a coating comprised of a water-soluble polymer which is crosslinkable into insoluble form by actinic radiation in the presence of hexavalent chromium ions, a water-soluble dichromate photosensitizer for said polymer, at least one water-soluble vanadate selected from the group consisting of sodium vanadate, potassium vanadate and ammonium vanadate, and said particulate material, said soluble vanadate being present in said coating in concentrations of about 0.1 to 4.0 weight percent of the weight of said water-soluble polymer, (b) exposing said coating to a pattern of said actinic radiation until exposed portions of said coating are rendered insoluble, (c) and flushing said exposed coating with an aqueous solvent to remove soluble portions of said coating while retaining insoluble portions of said coating in place.

2. The method defined in claim 1 wherein said dichromate photosensitizer is at least one member of the group consisting of sodium dichromate, potassium dichromate and ammonium dichromate.

3. The method defined in claim 1 wherein said water-soluble polymer is a polyvinyl alcohol.

4. A method for printing a phosphor-viewing-screen structure for a cathode-ray tube upon a supporting surface comprising (a) applying to said supporting surface a coating comprised of a polyvinyl alcohol, a soluble dichromate photosensitizer for said alcohol, at least one soluble vanadate selected from the group consisting of sodium vanadate, potassium vanadate and ammonium vanadate, and particles of phosphor for said screen structure, said soluble vanadate being present in said coating in concentrations of about 0.1 to 4.0 weight percent of the weight of said water-soluble polymer, (b) projecting a pattern of actinic light upon said coating until the exposed portions of said coating are rendered insoluble, (c) and flushing said exposed coating with an aqueous solvent to remove unexposed portions of said coating while retaining exposed portions of said coating in place.

* * * * *